(12) United States Patent
Matsumoto et al.

(10) Patent No.: US 9,543,271 B2
(45) Date of Patent: Jan. 10, 2017

(54) SEMICONDUCTOR DEVICE HAVING A SEALING LAYER COVERING A SEMICONDUCTOR MEMORY UNIT AND A MEMORY CONTROLLER

(71) Applicant: KABUSHIKI KAISHA TOSHIBA, Tokyo (JP)

(72) Inventors: Manabu Matsumoto, Yokohama Kanagawa (JP); Akira Tanimoto, Yokohama Kanagawa (JP); Isao Ozawa, Chigasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/837,997

(22) Filed: Aug. 27, 2015

(65) Prior Publication Data

US 2016/0268229 A1    Sep. 15, 2016

(30) Foreign Application Priority Data

Mar. 9, 2015  (JP) .................................. 2015-046517

(51) Int. Cl.
| | |
|---|---|
| *H01L 23/52* | (2006.01) |
| *H01L 25/03* | (2006.01) |
| *H01L 25/065* | (2006.01) |
| *H01L 25/00* | (2006.01) |
| *H01L 23/31* | (2006.01) |
| *H01L 23/00* | (2006.01) |
| *H01L 21/56* | (2006.01) |

(52) U.S. Cl.
CPC ......... *H01L 25/0652* (2013.01); *H01L 21/565* (2013.01); *H01L 23/3114* (2013.01); *H01L 24/49* (2013.01); *H01L 25/50* (2013.01); *H01L 2224/4941* (2013.01); *H01L 2224/49105* (2013.01); *H01L 2924/1436* (2013.01); *H01L 2924/1438* (2013.01); *H01L 2924/14511* (2013.01)

(58) Field of Classification Search
CPC .. H01L 25/0652; H01L 25/50; H01L 23/3113; H01L 24/49; H01L 21/565; H01L 2224/49105; H01L 2224/4941; H01L 2924/14511; H01L 2225/06524; H01L 2225/06565; H01L 25/0657; H01L 2225/06506; H01L 2224/48145; H01L 2924/00014; H01L 2924/00; H01L 2924/181; H01L 2224/4911
See application file for complete search history.

(56) References Cited

U.S. PATENT DOCUMENTS

| | | |
|---|---|---|
| 8,028,119 B2 | 9/2011 | Miura |
| 8,115,290 B2 | 2/2012 | Yamamoto et al. |
| 2015/0221624 A1* | 8/2015 | Ye .......................... H01L 25/00 257/777 |

FOREIGN PATENT DOCUMENTS

| | | |
|---|---|---|
| JP | 2003007963 A | 1/2003 |
| JP | 2005222228 A | 8/2005 |

* cited by examiner

*Primary Examiner* — Jasmine Clark
(74) *Attorney, Agent, or Firm* — Patterson & Sheridan, LLP

(57) ABSTRACT

A semiconductor device includes a substrate, a semiconductor memory unit mounted on a surface of the substrate, a memory controller configured to control the semiconductor memory unit and mounted on the surface of the substrate adjacent to the semiconductor memory unit, and a sealing layer disposed on the surface of the substrate and covering the semiconductor memory unit and the memory controller.

20 Claims, 13 Drawing Sheets

SEMICONDUCTOR DEVICE HAVING A SEALING LAYER COVERING A SEMICONDUCTOR MEMORY UNIT AND A MEMORY CONTROLLER

CROSS-REFERENCE TO RELATED APPLICATION

This application is based upon and claims the benefit of priority from Japanese Patent Application No. 2015-046517, filed Mar. 9, 2015, the entire contents of which are incorporated herein by reference.

FIELD

Exemplary embodiments described herein relate to a semiconductor device, in particular, a semiconductor device having a sealing layer covering a semiconductor memory unit and a memory controller.

BACKGROUND

A semiconductor device includes a controller and a semiconductor memory unit. Such a semiconductor device may be mounted on a variety of electronic apparatuses.

DESCRIPTION OF THE DRAWINGS

in FIG. 16, (a) is a front view, (b) is a rear view, and (c) is a side view.

DETAILED DESCRIPTION

An embodiment described herein provides a semiconductor device and an electronic apparatus which are capable of improving a degree of freedom of a design.

In general, according to an embodiment, a semiconductor device includes a substrate, a semiconductor memory unit mounted on a surface of the substrate, a memory controller configured to control the semiconductor memory unit and mounted on the surface of the substrate adjacent to the semiconductor memory unit, and a sealing layer disposed on the surface of the substrate and covering the semiconductor memory unit and the memory controller.

Hereinafter, embodiments will be described with reference to the accompanying drawings.

In the present disclosure, several components are described by a plurality of expressions. These expressions are examples and may be expressed by the other expressions. In addition, components which are not described by a plurality of expressions may also be expressed by different expressions.

In addition, the drawings are schematic, and a relationship between thickness and planar dimensions, a ratio of thicknesses of respective layers, and the like may be different from real ones. In addition, some portions may have different dimensional relationships and ratios between the drawings.

First Embodiment

Figure 1:
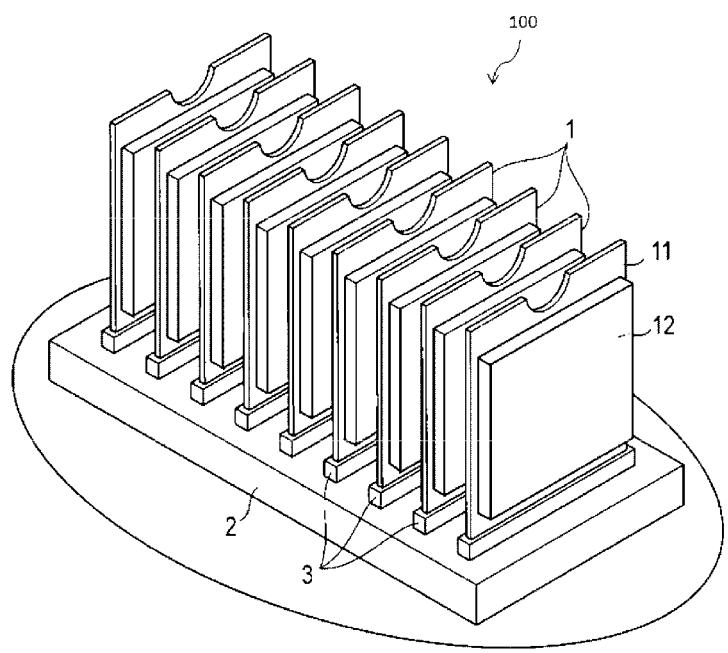
FIG. 1 is a perspective view of a system including a host device and a plurality of semiconductor devices according to a first embodiment.
Figure 2:
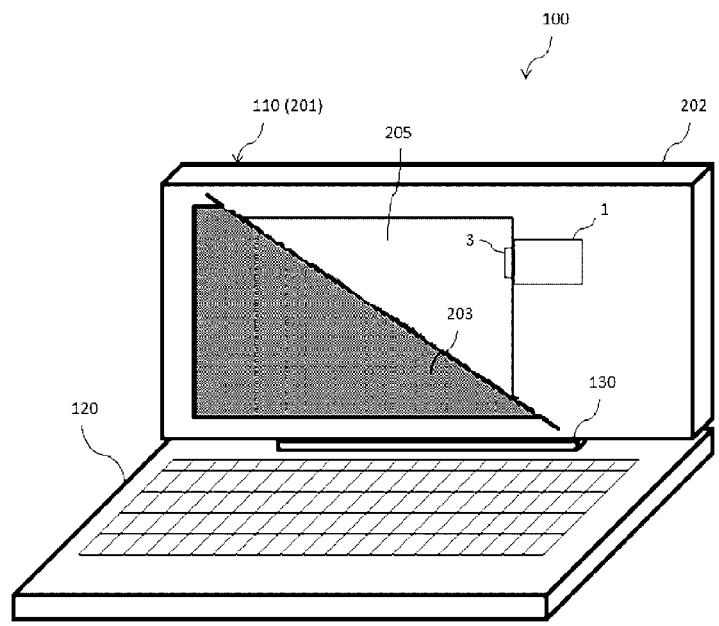
FIG. 2 is a partially transparent perspective view of a semiconductor device according to the first embodiment, that is mounted in a host device.
Figure 3:
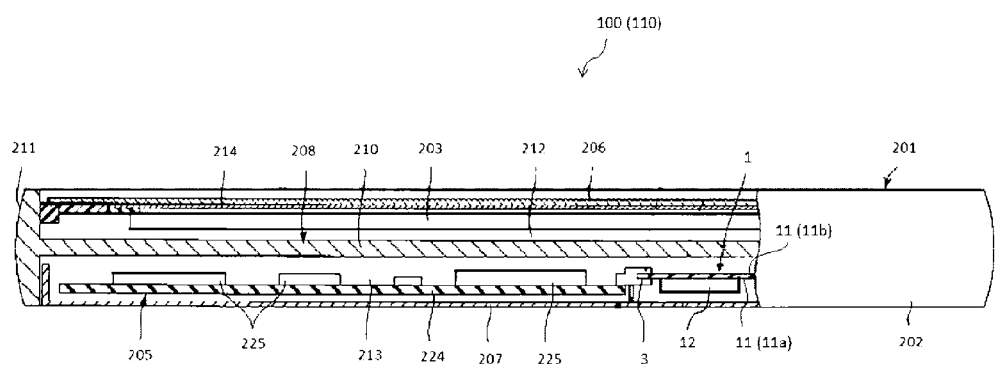
FIG. 3 is a partially transparent cross-sectional view of a tablet portion of the host device.

FIGS. 1 to 3 each show semiconductor device 1 according to a first embodiment and a system 100 into which the semiconductor device 1 is incorporated. The system 100 is an example of an "electronic apparatus." The semiconductor device 1 is an example of a "semiconductor module" and a "semiconductor memory device." The semiconductor device 1 according to the present embodiment is a memory system such as, for example, an SSD (Solid State Drive), but there is no limitation thereto.

The semiconductor device 1 according to the present embodiment is, for example, relatively small-sized module, and an example of the outside dimensions thereof is called M.2-2230 and has a size of 22 mm×30 mm. However, the size of the semiconductor device 1 is not limited thereto, and the configuration of the present embodiment may appropriately have various sizes.

As shown in FIG. 1, the semiconductor devices 1 are incorporated into the system 100 of, for example, a server or the like, as a memory device. The system 100 includes the semiconductor devices 1 and a host device 2 on which the semiconductor devices 1 are mounted. The host device 2 includes, for example, a plurality of connectors 3 (for example, slots) which are open upward. A plurality of semiconductor devices 1 is respectively connected to the connectors 3 of the host device 2, and supported side by side, standing up in an approximately vertical direction. According to such a configuration, it is possible to collectively mount the plurality of semiconductor devices 1 in a compact manner, and to achieve a reduction in the size of the host device 2.

The semiconductor device 1 may be used as a storage device of electronic apparatuses such as a notebook-type portable computer, a tablet terminal, or a detachable notebook PC (personal computer). Hereinafter, the semiconductor device 1 is assumed to be mounted to a detachable notebook PC corresponding to the host device 2 and described with reference to FIGS. 2 and 3. Here, the detachable notebook PC 2 including the semiconductor device 1 serves as the system 100.

FIG. 2 illustrates the semiconductor device 1 mounted on the detachable notebook PC 2. FIG. 3 is a cross-sectional view of a display portion 110 (tablet-type portable computer 201) of the detachable notebook PC 2 shown in FIG. 2. The detachable notebook PC 2 is configured such that the display portion 110 and a keyboard portion 120, which is a first input receiving device, are detachably connected to each other by a connection portion 130.

As shown in FIGS. 2 and 3, the semiconductor device 1 is mounted on the display portion 110 of the detachable notebook PC 2. For this reason, even when the display portion 110 is detached from the keyboard portion 120, the display portion 110 may function as the tablet-type portable computer 201 and as a second input receiving device.

The portable computer 201 is an example of an electronic apparatus, and has a handheld size.

The portable computer 201 includes a housing 202, a display module 203, the semiconductor device 1, and a motherboard 205, as main components. The housing 202 includes a protective plate 206, a base 207, and a frame 208. The protective plate 206 is a glass or plastic square plate, and configures the surface of the housing 202. The base 207 is made of metal such as, for example, an aluminum alloy or a magnesium alloy, and configures the bottom of the housing 202.

The frame 208 is provided between the protective plate 206 and the base 207. The frame 208 is made of metal such as, for example, an aluminum alloy or a magnesium alloy, and includes a mounting portion 210 and a bumper portion 211 integrally. The mounting portion 210 is provided between the protective plate 206 and the base 207. According to the present embodiment, a first mounting space 212 is formed between the mounting portion 210 and the protective plate 206, and a second mounting space 213 is formed between the mounting portion and the base 7.

The bumper portion 211 is integrally formed on the outer circumference edge of the mounting portion 210, and surrounds the first mounting space 212 and the second mounting space 213 continuously in a circumferential direction. Further, the bumper portion 211 extends in the thickness direction of the housing 202 between the outer circumference edge of the protective plate 206 and the outer circumference edge of the base 207, and configures the outer circumferential surface of the housing 202.

The display module 203 is disposed in the first mounting space 212 of the housing 202. The display module 203 is covered with the protective plate 206, and a touch panel 214 having a handwriting input function is disposed between the protective plate 206 and the display module 203. The touch panel 214 is bonded to the rear surface of the protective plate 206.

As shown in FIG. 3, the semiconductor device 1 is disposed in the second mounting space 213 of the housing 202 together with the motherboard 205. The semiconductor device 1 includes a substrate 11 and a semiconductor package 12.

The substrate 11 includes a mounting surface 11a on which a plurality of conductor patterns is formed. The semiconductor package 12 is mounted on the mounting surface 11a of the substrate 11 and soldered to the conductor patterns (not shown).

The motherboard 205 includes a plurality of circuit components 225 such as a substrate 224, the semiconductor package, and a chip. The substrate 224 has a plurality of conductor patterns (not shown) formed thereon. The circuit components 225 are mounted on the substrate 224 and electrically connected to the conductor patterns of the substrate 224 with soldering.

As shown in FIG. 3, the semiconductor device 1 according to the present embodiment is mounted in a single-sided manner, and the mounting surface 11a of the substrate 11 is directed opposite to the display module 203. In other words, the semiconductor device according to the present embodiment is configured such that a surface 11b on which a component, such as the semiconductor package 12, protruding from the surface of the substrate 11 is not mounted is directed to the display module 203. As the substrate 11 is disposed between the semiconductor package 12 and the display module 203, it is possible to reduce mutual thermal interference between the display module 203 and the semiconductor package 12. Hereinafter, the detailed configuration of the semiconductor device 1 according to the present embodiment will be described with reference to FIGS. 4 to 9.

Figure 4:
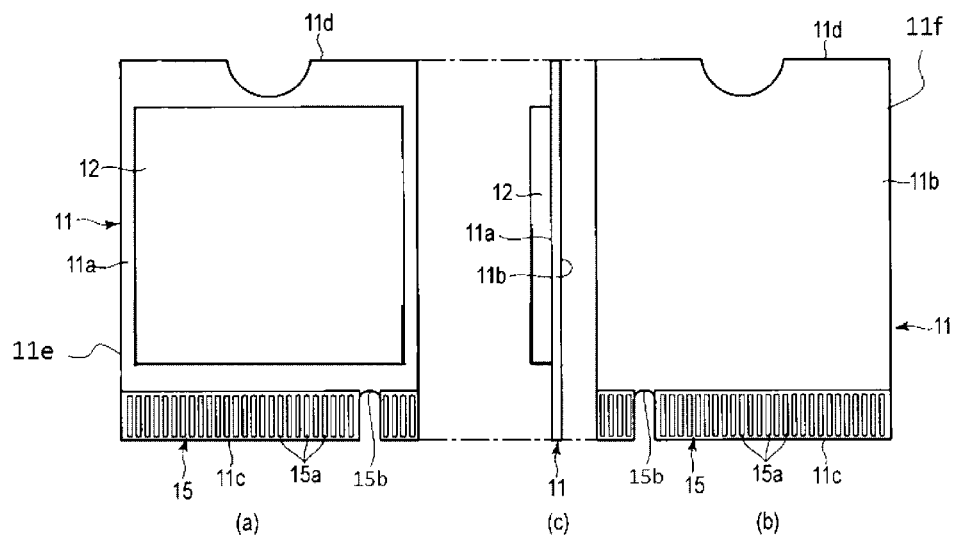
FIG. 4 illustrates the semiconductor device according to the first embodiment; (a) is a front plan view, (b) is a rear plan view, and (c) 4 is a side view thereof.

FIG. 4 shows the appearance of the semiconductor device 1. In FIG. 4, (a) is a top plan view, (b) is a bottom plan view, and (c) is a side view of the semiconductor device 1. As shown in FIG. 4, the semiconductor device 1 includes the substrate 11 and the semiconductor package 12.

The substrate 11 is, for example, a substantially rectangular printed substrate which is formed of a material such as a glass epoxy resin, and defines the outside dimensions of the semiconductor device 1. The substrate 11 includes a first surface 11a and a second surface 11b which is located on aside opposite to the first surface 11a. The first surface 11a is a component mounting surface on which the semiconductor package 12 is mounted. The semiconductor device 1 according to the present embodiment is configured such that the plurality of components provided independently of the substrate 11, as described above, is mounted chiefly on the single-sided surface (11a) of the substrate 11 during manufacturing of the semiconductor device 1. The plurality of components mounted on the first surface 11a is integrally mounted components, on appearance, as the semiconductor package 12 which is collectively sealed with a resin material. Here, "integrally" in the present example refers to a state of non-detachable bonding, and the "integrally mounted components" are treated as one module unit during manufacturing of the semiconductor device 1. On the other hand, the second surface 11b is a non-component mounting surface on which a component is not mounted. As a plurality of components provided independently of the substrate 11 is arranged so as to be concentrated on one surface of the substrate 11, the protrusive components may be concentrated on one side of the substrate 11. Thereby, as compared to a case where the protrusive components are formed on both of the first surface 11a and the second surface 11b of the substrate 11, it is possible to reduce the thickness of the semiconductor device 1.

As shown in FIG. 4, the substrate 11 includes a first edge 11c and a second edge 11d opposite to the first edge 11c. The first edge 11c includes an interface portion 15 (substrate interface portion, terminal portion, and connection portion). The interface portion 15 includes, for example, a plurality of connection terminals 15a (metal terminals). The interface portion 15 is inserted into a connector 3 of the host device 2 and electrically connected to the connector 3. The interface portion 15 transmits signals (control signals and data signals) between the interface portion 15 and the host device 2.

The interface portion 15 according to the present embodiment is, for example, an interface based on the standard of PCI Express (hereinafter, PCIe). That is, a high speed signal (high speed differential signal) based on the standard of PCIe flows between the interface portion 15 and the host device 2. The interface portion 15 may be based on, for example, other standards. The semiconductor device 1 receives a supply of power from the host device 2 through the interface portion 15.

In the interface portion 15, a slit 15b is formed at a position offset from a central position along the short-side direction of the substrate 11, and is fit with a protrusion (not shown) or the like which is provided on the connector 3 of the host device 2. As a result, it is possible to prevent the semiconductor device 1 from being attached back to front.

Next, the semiconductor package 12, which is mounted on the substrate 11, will be described in detail with reference to FIGS. 5 to 9. The semiconductor package 12 according to the present embodiment is a SiP (System in Package) type module, and has a plurality of semiconductor chips sealed within one package.

Figure 5:
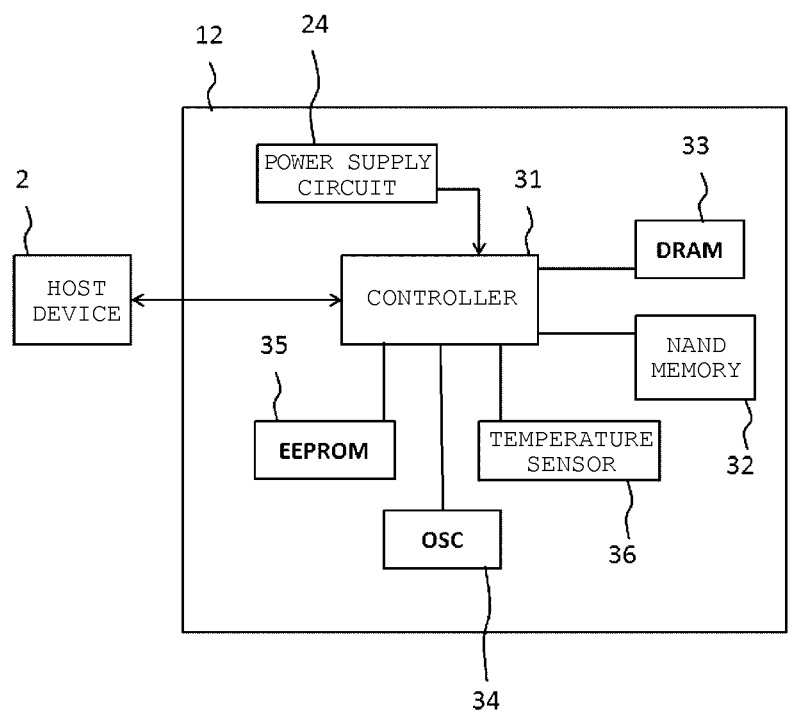
FIG. 5 is a block diagram of a semiconductor package in the semiconductor device according to the first embodiment.

FIG. 5 shows an example of the system configuration of the semiconductor package 12. The semiconductor package 12 includes a power supply component 24, a controller 31, a plurality of semiconductor memories 32, a DRAM (Dynamic Random Access Memory) 33, an oscillator (OSC) 34, an EEPROM (Electrically Erasable and Programmable ROM) 35, a temperature sensor 36, and electronic components such as resistors and capacitors (not shown in FIG. 5).

The power supply component 24 is, for example, a DC-DC converter, and generates a predetermined voltage required in the semiconductor package 12 or the like using power supplied from the host device 2. The controller 31 controls operations of the plurality of semiconductor memories 32. That is, the controller 31 controls writing, reading, and erasure of data with respect to the plurality of semiconductor memories 32. Each of the plurality of semiconductor memories 32 is, for example, a NAND memory (NAND-type flash memory). The NAND memory is an example of a non-volatile memory. The DRAM 33 is an example of a volatile memory, and is used for storing management information of the semiconductor memory 32, caching data, and the like. The oscillator 34 supplies an operation signal of a predetermined frequency to the controller 31. The EEPROM 35 stores a control program or the like as fixed information. The temperature sensor 36 detects a temperature within the semiconductor package 12 and notifies the controller 31 of the temperature.

Figure 6:
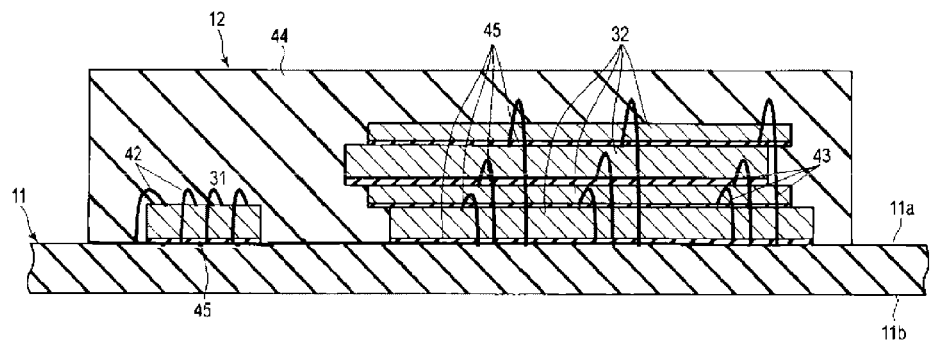
FIG. 6 is a cross-sectional view of the semiconductor device according to the first embodiment.

FIG. 6 shows a cross-section of the semiconductor package 12. The semiconductor package 12 includes the controller 31, the plurality of semiconductor memories 32, bonding wires 42 and 43, a sealing portion 44, and a mount film 45.

The substrate 11 is, for example, a multilayer interconnect substrate, and includes a power supply layer and a ground layer which are not shown in FIG. 6. The controller 31 is placed on the first surface 11a of the substrate 11, and is fixed to the substrate 11 by, for example, the mount film 45. The controller 31 is electrically connected to the substrate 11 by the bonding wire 42.

The plurality of semiconductor memories 32 is stacked on the first surface 11a of the substrate 11. The plurality of semiconductor memories 32 is fixed to the substrate 11 by the mount film 45, and is electrically connected to the substrate 11 by the bonding wire 43. The semiconductor memories 32 are electrically connected to the controller 31 through the substrate 11.

The sealing portion 44 (molding material) is provided on the first surface 11a of the substrate 11. The sealing portion 44 collectively seals (integrally covers) the power supply component 24, the controller 31, the plurality of semiconductor memories 32, the bonding wires 42 and 43, the DRAM 33, the oscillator 34, the EEPROM 35, the temperature sensor 36, and electronic components, such as resistors and capacitors, which are mounted on the first surface 11a of the substrate 11.

Figure 7:
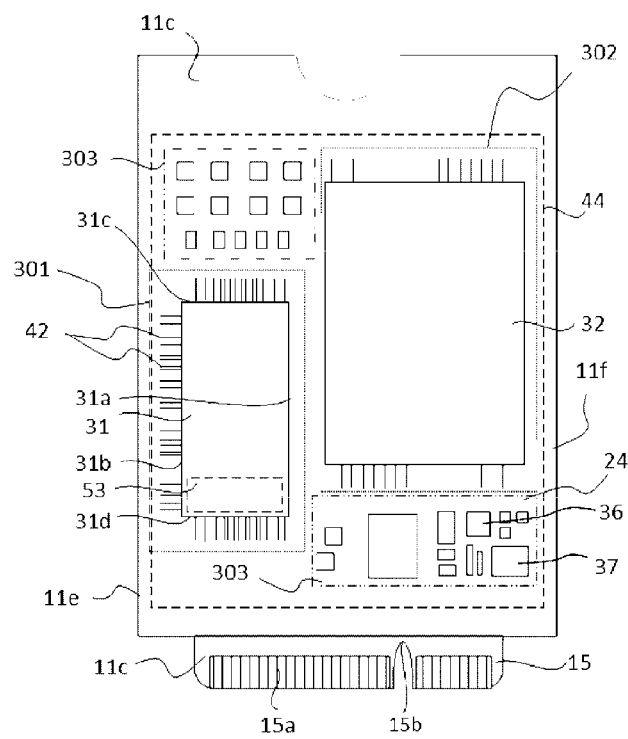
FIG. 7 is a top view of an internal configuration of the semiconductor package.
Figure 8:
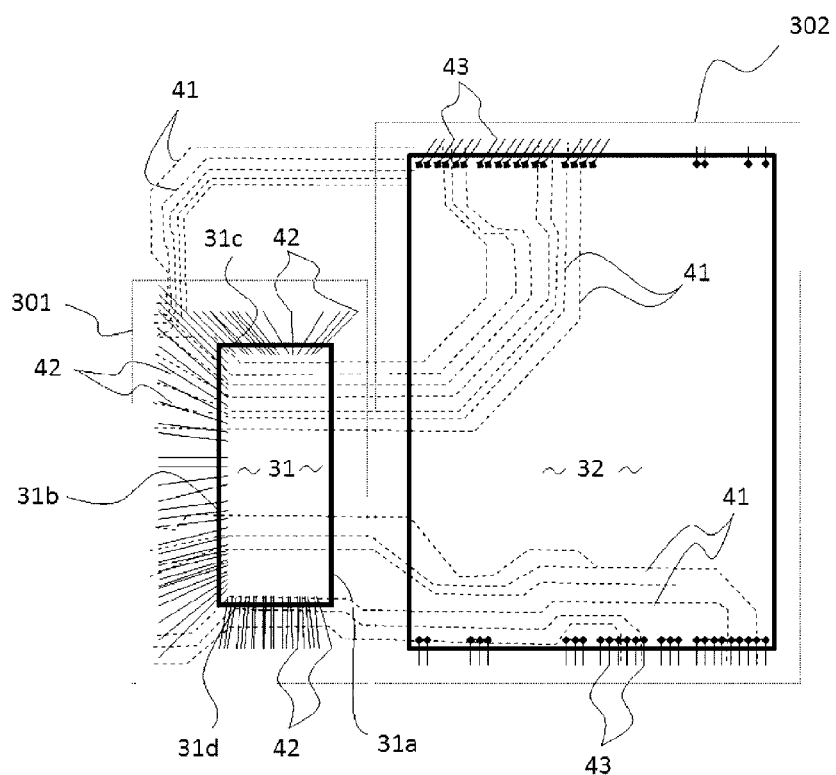
FIG. 8 is a top view of a wiring connection between a controller and a semiconductor memory of the semiconductor device according to the first embodiment.

FIG. 7 illustrates an internal configuration of the semiconductor package 12. FIG. 8 illustrates a wiring configuration of peripheral regions of the controller 31 and the semiconductor memory 32. As shown in FIGS. 7 and 8, the controller 31 according to the present embodiment is substantially rectangular in shape, and includes a first edge 31a in a longitudinal direction, a second edge 31b opposite to the first edge 31a, a third edge 31c in a short-side direction, and a fourth edge 31d opposite to the third edge 31c. Meanwhile, the first edge 31a is located on the side of the semiconductor memory 32 which is mounted on the substrate 11 adjacent to the controller 31, and the third edge 31c is located on the side of the interface portion 15 which is provided on the substrate 11.

As shown in FIG. 7, a region covered with the sealing portion 44 within the semiconductor package 12 has a first mounting region 301 in which the controller 31 is mounted, a second mounting region 302 in which the semiconductor memory 32 is mounted, and third mounting regions 303 apart from the first mounting region 301 and the second mounting region 302. Components other than the controller 31 and the semiconductor memory 32, such as resistors and capacitors, are mounted in the mounting region 303 separated from each other. In the present example, the third mounting regions 303 are respectively provided at a place adjacent to the third edge 11c of the substrate 11 and a place adjacent to the fourth edge 11d thereof. Electronic components configuring the power supply circuit 24 are concentrated on a side close to the interface portion 15 as a connector, and components having a mounting height larger than that other capacitors, resistors, and the like such as the temperature sensor 36 and a load switch 37 are also arranged on the side.

As shown in FIG. 7, the controller 31 of the present embodiment includes connection terminals formed of the bonding wire 42 on the second edge 31b, the third edge 31c, and the fourth edge 31d, which are three edges except the first edge 31a, and electrical connection to various other electronic components including the controller 31 and the substrate 11 is established through these connection terminals.

In addition, the connection terminal is not provided on the first edge 31a of the controller 31, and thus a distance between the semiconductor memories 32 adjacent to each other may be set to become closer, which leads to an advantage of a reduction in the size of the semiconductor device 1. In addition, when the bonding wire 42 is formed so as to be closely packed, workability may improve.

Further, the controller 31 generally generates heat more than other electronic components including the semiconductor memory 32. For this reason, in the present embodiment, heat generated in the controller 31 is transferred towards the substrate 11 through the bonding wire 42, which has high thermal conductivity.

On the other hand, the operation capability of the semiconductor memory 32 changes depending on environmental temperature. In particular, exhaustion progresses by continuously driving under high-temperature environment, and as a result, memory capability reduces.

As shown in FIG. 8, in the present embodiment, the bonding wire 42 is not arranged on the side of the first edge 31a of the controller 31, and a connection terminal to the substrate 11 is not included in the side portion of the first edge 31a. A signal from the controller 31 is transmitted to the semiconductor memory 32 through the bonding wire 42 by a wiring pattern 41 provided in the surface layer or inner layer of the substrate 11. Therefore, it is possible to avoid heat generated by the controller 31 from being transmitted to the semiconductor memory 32 through the closely packed bonding wire 42. That is, it is possible to suppress the radiation of heat from the first edge 31a close to the semiconductor memory 32 which may have lower performance under heat, and to suppress the influence of the heat generated by the controller 31 on the semiconductor memory 32.

As shown in FIG. 8, in the present embodiment, the bonding wire 42, which is electrically connected to the semiconductor memory 32 through the wiring pattern 41, is concentrated on the side of the second edge 31b of the controller 31. In this manner, connection terminals are concentrated on a side portion of four sides which is farthest from the semiconductor memory 32, and thus it is possible to further suppress the transmission of heat from the controller 31 to the semiconductor memory 32.

In addition, in the present embodiment, the bonding wire 42 of the controller 31 is concentrated on both ends of the second edge 31b, that is, near the third edge 31c and the fourth edge 31d, and thus a distance to the bonding wire 43 provided on both ends of the semiconductor memory 32 can be closer, whereby it is possible to shorten a routing distance of the wiring pattern 41, and to prevent the wiring pattern 41 from passing through the central portion of the semiconductor memory 32. Thereby, the metallic wiring pattern 41 may be prevented from being concentrated on the central portion of the semiconductor memory 32, which leads to reduction in heat transfer to the semiconductor memory 32.

Figure 9:
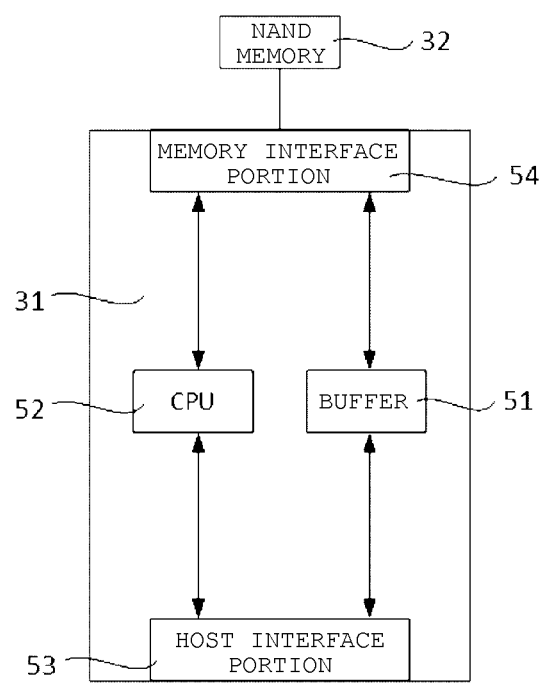
FIG. 9 is a block diagram of the controller.

FIG. 9 illustrates an example of the system configuration of the controller 31. As shown in FIG. 9, the controller 31 includes a buffer 51, a CPU 52 (Central Processing Unit), a host interface portion 53, and a memory interface portion 54.

The buffer 51 temporarily stores a certain amount of data when data from the host device 2 is written in the semiconductor memory 32, or temporarily stores a certain amount of data when data from the semiconductor memory 32 is sent out to the host device 2.

The CPU 52 controls the semiconductor package 12 and the semiconductor devices 1. The CPU 52 receives, for example, a write command, a read command, and an erasure command from the host device 2 and accesses a corresponding region of the semiconductor memory 32, or controls data transferring through the buffer 51.

The host interface portion 53 is located between the interface portion 15 of the substrate 11 and the CPU 52 and between the interface portion 15 and the buffer 51. The host interface portion 53 performs interfacing between the controller 31 and the host device 2. A high speed signal of PCIe, for example, flows between the host interface portion 53 and the host device 2.

The host interface portion 53 is arranged closer to the third edge 31c within the controller 31. In this case, wiring between the host interface portion 53 and the interface portion 15 of the substrate 11 can have an approximately shortest distance from the controller.

For example, when the host interface portion 53 is arranged closer to the fourth edge 31d within the controller 31, a wiring distance extends by the length of the controller chip in a longitudinal direction. As the wiring becomes longer, parasitic capacitance, parasitic resistance, parasitic inductance, and the like increase, which leads to change in the characteristic impedance of a signal wiring. In addition, a signal delay may be caused.

From the above-mentioned viewpoint, in the present embodiment, the host interface portion 53 is preferably arranged closer to the third edge 31c within the controller 31. As a result, the operational stability of the semiconductor device 1 can be improved.

The memory interface portion 54 is located between the semiconductor memory 32 and the CPU 52 and between the semiconductor memory 32 and the buffer 51. The host interface portion 53 performs interfacing between the controller 31 and the semiconductor memory 32.

Next, a method of manufacturing the semiconductor device according to the present embodiment will be described. First, the mount film 45 having a substantially rectangular shape is attached to a predetermined position on the first surface 11a of the substrate 11. The long side of the mount film 45 and the long side of the substrate 11 are attached to each other so as to be set in the same direction.

Next, the controller 31 is disposed on the mount film 45 so that the host interface portion 53 is located on the side of the interface portion 15 of the substrate 11. The controller 31 is fixed onto the first surface 11a of the substrate 11 by the mount film 45.

Figure 10:
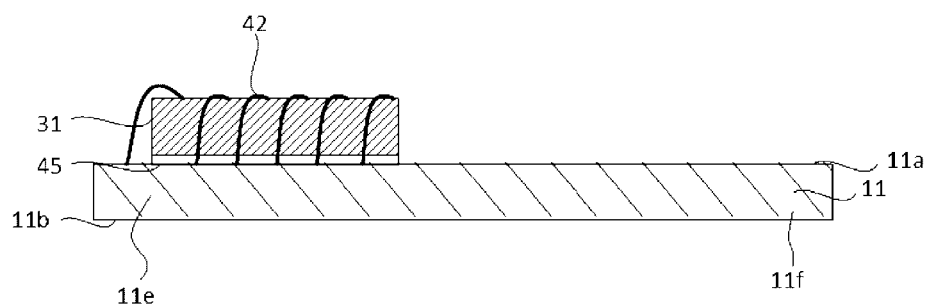
FIGS. 10-12 are a cross-sectional view of the semiconductor device to illustrate a step of manufacturing the semiconductor device.

In addition, as shown in FIG. 10, the controller 31 is electrically connected to the substrate 11 by the bonding wire 42. In this case, as shown in FIG. 7, the bonding wire 42 is not connected to the substrate 11 from the side of the first edge 31a of the controller 31. In such a manner, the controller 31 is mounted on the first surface 11a of the substrate 11.

Subsequently, the mount film 45 is attached near the first edge 31a of the controller 31, so that the mount film 45 is separated from the controller 31 by a predetermined distance. Here, the long side of the mount film 45 and the long side of the substrate 11 are attached to each other so as to be set in the same direction. Meanwhile, the "predetermined distance" here means that the distance is smaller than a distance required when a bonding wire is also included on the side of the first edge 31a of the controller 31.

Figure 11:
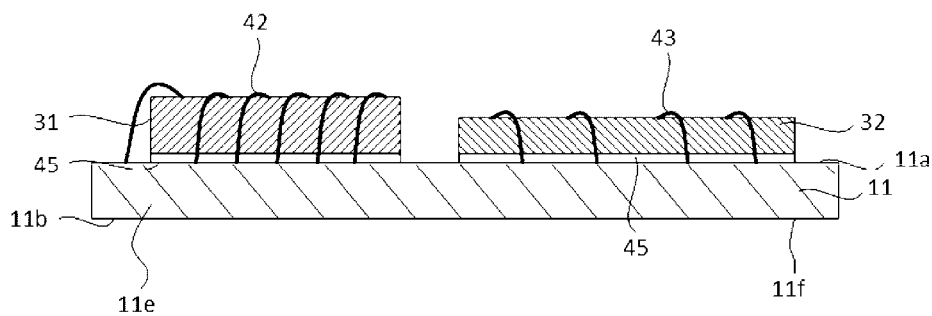

Thereafter, the semiconductor memory 32 is disposed on the mount film 45. The semiconductor memory 32 is fixed onto the first surface 11a of the substrate 11 by the mount film 45. In addition, the semiconductor memory 32 is electrically connected to the substrate 11 by the bonding wire 43. This step is shown in FIG. 11.

Figure 12:
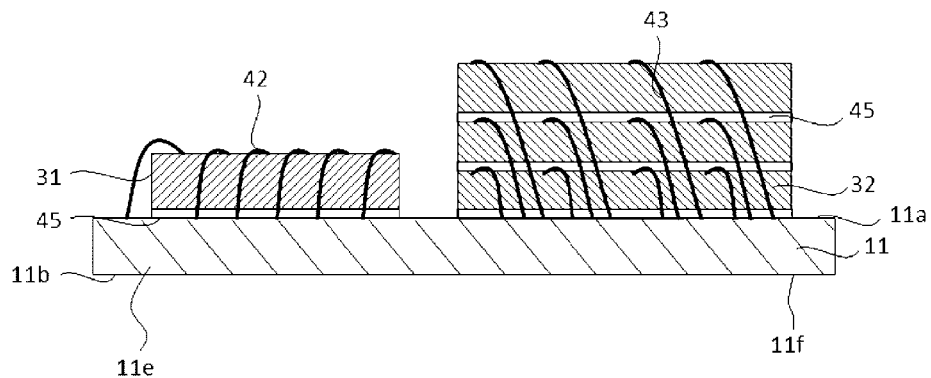

Further, a new mount film 45 is attached onto the semiconductor memory 32, and a semiconductor memory 32 is stacked again. By repeating this step, as shown in FIG. 12, a plurality of semiconductor memories 32 is stacked, and mounted on the first surface 11a of the substrate 11. Each of the plurality of semiconductor memories 32 stacked is electrically connected to the substrate 11 by the bonding wire 43. In addition, the plurality of semiconductor memories 32 stacked is also connected to each other by the bonding wire 43.

Subsequently, other electronic components (power supply component 24, DRAM 33, oscillator 34, EEPROM 35, temperature sensor 36, resistor, and capacitor) are respectively mounted in mounting regions in the first surface 11a of the substrate 11. It is preferable that electronic components be not mounted between the host interface portion 53 of the controller 31 and the interface portion 15 of the substrate 11.

As described above, when a wiring distance between the host interface portion 53 and the interface portion 15 is large, it would be difficult to maintain the impedance of a signal wiring, a signal delay may be caused. In order to connect the host interface portion 53 and the interface portion 15 at a shortest distance, that is, linearly, it is not be preferable that electronic components be mounted between the host interface portion 53 and the interface portion 15.

In addition, electronic components such as the power supply component 24 and the DRAM 33 may be subjected to noise during the operations thereof. As these electronic components have a power supply component not being mounted between the host interface portion 53 and the interface portion 15, signals transmitted between the host interface portion 53 and the interface portion 15 is less likely to contain noise, thereby the operational stability of the semiconductor device 1 can be improved.

For the similar reason, it is preferable that electronic components such as the power supply component 24 and the DRAM 33 be not mounted between the memory interface portion 54 of the controller 31 and the semiconductor memory 32 on the substrate 11. In addition, generally, it is preferable that the DRAM 33 be installed in the vicinity of the controller 31.

Further, as described above, the power supply component generates a predetermined voltage required in the semiconductor package 12 or the like using power supplied from the host device 2. Therefore, in order to suppress a loss of the power supply from the host device 2, it is preferable that the power supply component 24 be installed in the vicinity of the interface portion 15.

Here, the range of the "vicinity" in the present embodiment means, for example, a distance of such a degree as to be able to mount a semiconductor component such as one BGA (Ball Grid Array) or LGA (Land Grid Array), or a circuit. Specifically, when referring to the vicinity of a predetermined structure and portion, the vicinity indicates a surrounding region of the structure in a range in which approximately one semiconductor component or circuit may be arranged and mounted. Therefore, for example, the "vicinity of the interface portion 15" in the present embodiment indicates even a region of the power supply component 5 around the interface portion 15 in the substrate 11.

Finally, all electronic components mounted on the first surface 11a of the substrate 11 are sealed (molded). In the present embodiment, resin sealing is performed. A resin (molding material) used in the resin sealing is, for example, a thermosetting epoxy resin, but there is no limitation thereto.

Figure 13:
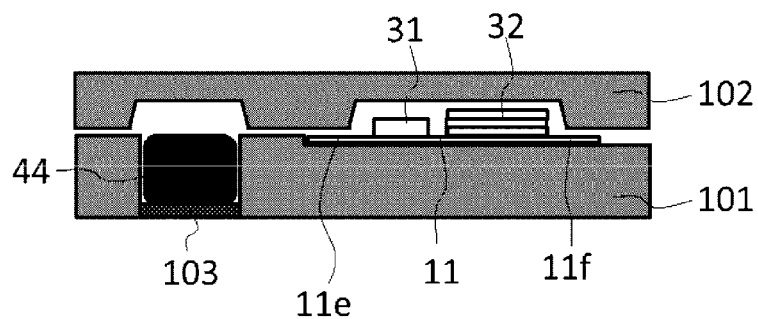
FIGS. 13-15 are a cross-sectional view of the semiconductor device to illustrate a process of sealing the semiconductor device.
Figure 14:
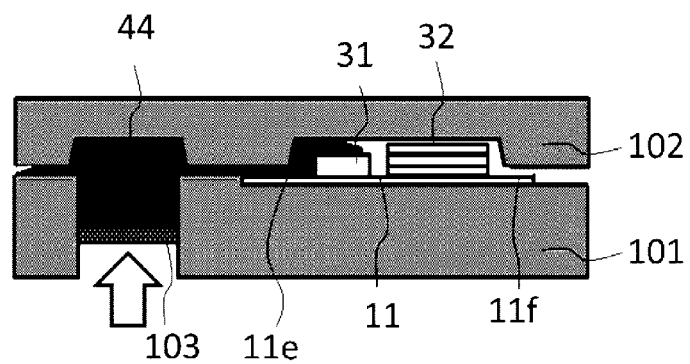
Figure 15:
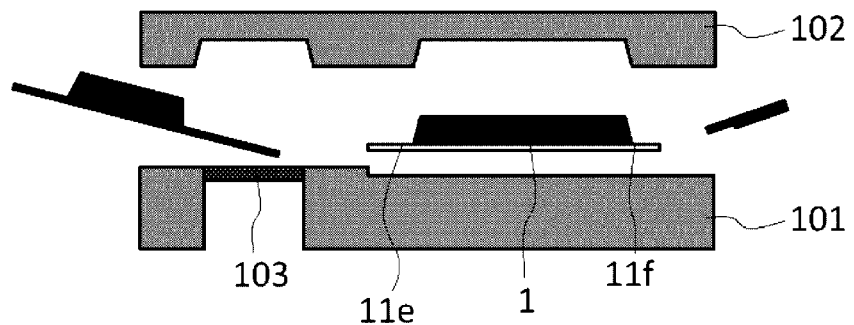

A sealing procedure in manufacture of the semiconductor device according to the present embodiment is shown in FIGS. 13 to 15. Meanwhile, in the present embodiment, the molding material 44 flows from the third edge 11e of the substrate 11 toward the fourth edge 11f. As the molding material 44 is not in contact with the interface portion 15 of the substrate 11, it is possible to avoid the molding material 44 from interfering the function, characteristics, and the like of the interface portion 15.

First, as shown in FIG. 13, the substrate 11 and the molding material 44 are placed on a first mold 101 and interposed between the first mold 101 and the second mold 102. Here, a surface 103 on which the molding material of the first mold 101 is placed may be operated up and down.

Next, while heat is applied to the molding material 44 and the material is dissolved, the surface 103 is pushed upward, and the molding material 44 is caused to flow towards the substrate 11 as shown in FIG. 14. Thereafter, when the molding material 44 flows completely into the entire mold, the molding material is left behind for a while and cooled. After some time passes, the molding material 44 is fixed onto the substrate 11 and the molding material 44 which is in a fluid state is solidified.

Finally, as shown in FIG. 15, the substrate 11 is extracted from the mold, and unnecessary molding materials are removed (deburring is performed). Thereby, all components mounted on the substrate 11 are sealed by the molding material 44, and the semiconductor device 1 having the semiconductor package 12 mounted on the substrate 11 is manufactured.

As shown in FIGS. 13 to 15, the molding material 44 flows from the controller 31 toward the stacked semiconductor memory 32 having a mounting height larger than the controller 31 by a plurality of semiconductor memories overlapping each other. In addition, components having a mounting height larger than those of capacitors, resistors, and the like, such as the temperature sensor 36 and the load switch 37, are also arranged on the substrate 11f when viewed from the central position of the substrate 11. In this manner, the molding material 44 is lined up in a flow direction from a component having a small mounting height to a component having a large mounting height, and thus the flow rate of the molding material 44 which is applied onto the substrate 11 is not likely to drop until the molding material reaches the substrate 11f. For example, it is possible to avoid the flow rate from remarkably slowing down due to the molding material 44 contacting an upstanding wall configured with the lateral side of the stacked semiconductor memory 32, and to suppress generation of a void.

As described above, the components such as resistors and capacitors which are mounted in the mounting regions 303 of the substrate 11 are separated from each other by a predetermined distance. When these components are disposed in a closely packed manner, the molding material is unlikely to enter a gap between the components, and a void is unlikely to be generated. A portion in which the void is formed is in a state where the molding material and the substrate are not bonded to each other, and mounting reliability may be decreased. Therefore, in the present embodiment, it is preferable that the components such as resistors and capacitors be mounted so as to be separated from each other such that a void is not generated, and a distance between these components, for example, is larger than a distance between the bonding wires 42 and 43, or a distance between individual solder balls.

Today, a further reduction in the size and thickness of the semiconductor device 1 and the high-density mounting thereof is desired, and, for example, outside dimensions of 22 mm×30 mm size and single-sided mounting are desired.

Here, for the purpose of comparison, it is assumed that a semiconductor device has the controller and the semiconductor memory mounted separately on the substrate. In such a semiconductor device, when the size of the substrate is reduced to some extent (for example, M.2-2230) and the controller and the semiconductor memory are arranged in individual packages, the controller and the semiconductor memory may not fit within the component mounting region.

To the contrary, in the present embodiment, the semiconductor package 12 is a so-called SiP component in which all electronic components such as the controller 31, the semiconductor memory 32, and the DRAM 33 are collectively sealed by the sealing portion 44. According to such a configuration, even when the size of the substrate 11 is reduced to some extent, it is possible to dispose the controller 31 and the semiconductor memory 32 at a high density.

In addition, in the present embodiment, all components including the controller 31 and the semiconductor memory 32 are collectively sealed by the semiconductor package 12, and a substrate mounting component is mounted on the first surface 11a. On the other hand, the second surface 11b is designed as a non-component mounting surface on which the substrate mounting component is not mounted. Thereby, as compared with a mounting configuration in which the substrate mounting component protruding from the surface is mounted on both sides of the substrate 11, it is possible to reduce thickness of the semiconductor device 1.

In the present embodiment, the controller 31 mounted on the substrate 11 is electrically connected to the substrate 11 without using a BGA. When a BGA is used, solder balls are arranged on the entire substrate, and heat is transferred from a bottom facing the substrate 11 of the controller 31 to the substrate through the solder balls and other electronic components. However, in the present embodiment, electrical connection between the substrate 11 and the controller 31 is established by the bonding wire 42, the efficiency of heat transfer through the solder balls from the controller 31 to the substrate 11 is reduced, and the semiconductor memory 32 is not likely to receive an influence due to the heat dissipation of the controller 31.

In addition, the substrate 11 according to the present embodiment is a printed substrate and formed of a material such as a glass epoxy resin, as described above, and is deformed with a change in temperature. When a BGA is used in the present embodiment, the substrate 11 is thermally expanded at a region, such as a surface portion facing the controller 31 or a portion to which the solder ball is bonded, which is set to be in a high-temperature state, and distortion of the substrate 11 may occur at the mounting region of the controller 31. In addition, since the substrate 11, the package substrate of the controller 31, and the package substrate of the semiconductor memory 32 are different from each other in thermal expansion coefficient, stress is concentrated with respect to solder balls, if used, which are fixed therebetween, and thus dissolution, a crack, or the like of the solder balls may be generated.

However, in the present embodiment, the substrate 11 and electronic components such as the controller 31 are connected to each other using a bonding wire without using the package substrate and the solder balls. In addition, the substrate 11 and electronic components such as the controller 31 are fixed to each other by the mount film 45. Therefore, the semiconductor device 1 according to the present embodiment can improve mounting reliability without any problem such as dissolution, a crack, or the like of the solder balls.

In addition, the semiconductor device 1 according to the present embodiment, which is, for example, an SSD, may be carried out to various places because of its portability. In addition, the semiconductor device may stay being connected to the host device. During usage, dust or the like in the air may be attached to the semiconductor device 1. In the semiconductor device 1 according to the present embodiment, since the electronic components mounted on the substrate 11 are collectively sealed, it is possible to reduce influence of the dust on each of the electronic components.

Further, the semiconductor device 1 according to the present embodiment has a structure in which the semiconductor package is directly contacted onto the substrate 11 as described above. Therefore, without exposing a terminal for connecting the semiconductor package and the substrate 11, a signal from the terminal is not likely to be read at an exposed portion.

The first embodiment and the modification example are described as above, but the embodiment of the semiconductor device 1 is not limited thereto. Next, a semiconductor device according to a second embodiment will be described. Meanwhile, components having the same or similar functions as those of the components in the first embodiment are described using the same reference numerals and signs, and the description thereof may not be given. In addition, configurations other than those described below are the same as those of the first embodiment.

Second Embodiment

The semiconductor device 1 according to the first embodiment has components mounted only on the first surface 11a of the substrate 11 as described above. Thereby, the thickness of the semiconductor device 1 may be reduced, which leads to space saving. On the other hand, components may be mounted on the second surface 11b to provide other functions. In the present embodiment, a test pad is provided on the rear surface of the substrate. As a result, the performance confirmation of a product is facilitated.

Figure 16:
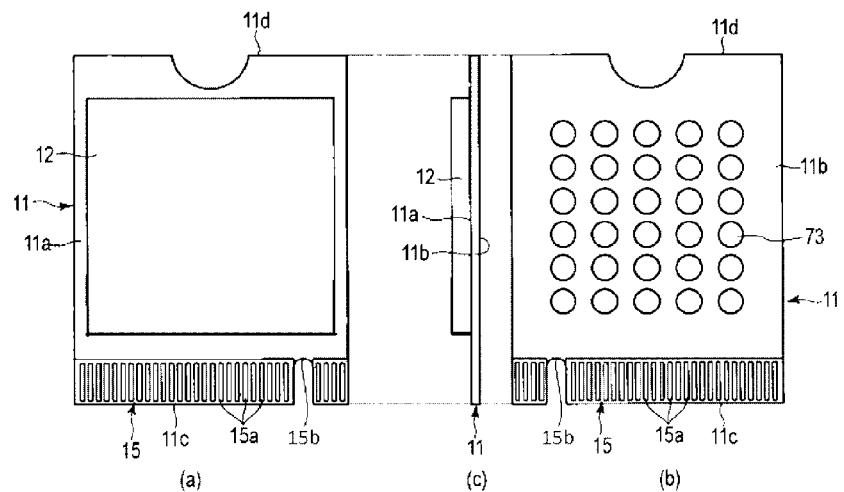
FIG. 16 illustrates a semiconductor device according to a second embodiment.
Figure 17:
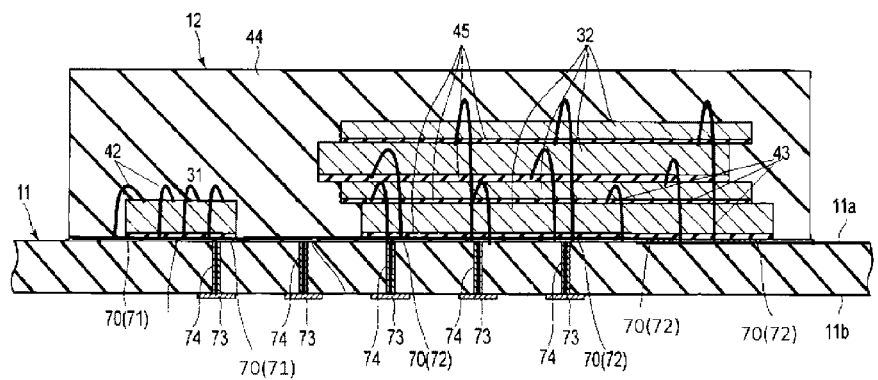
FIG. 17 is a cross-sectional view of the semiconductor device according to the second embodiment.

A specific example of a semiconductor device 1 according to the present embodiment is shown in FIGS. 16A to 16C. In FIG. 16A to 16C, FIG. 16A is a top plan view, FIG. 16B is a bottom plan view, and FIG. 16C is a side view of the semiconductor device 1. In addition, FIG. 17 is a cross-sectional view of a semiconductor package 12.

The bonding wires 42 and 43 of the semiconductor package 12 include a plurality of bonding wires. The plurality of bonding wires is electrically connected to the inside of the controller 31 through the host interface portion 53. A control signal or a data signal based on a high speed signal of PCIe flow from the host device 2 to some bonding wires 42. In addition, a power supply current is supplied to some other bonding wires 42.

For example, the bonding wire 42 to which a signal flows is arranged closer to the interface portion 15 of the substrate 11, that is, on the side of the third edge 31c, in the controller 31. As a result, it is possible to shorten a wiring length between the bonding wire 42 and the interface portion 15 of the substrate 11, and to improve a high-speed operation of the semiconductor package 12.

On the other hand, the bonding wire 43 is not connected to the host interface portion 53. Some bonding wires 43 are electrically connected to the inside of the controller 31 without going through the host interface portion 53. In addition, some other bonding wires 43 are electrically connected to an input terminal for test of the semiconductor package 12.

Specifically, the bonding wire 43 may be electrically connected to the memory interface portion 54 in the controller 31, without going through the host interface portion 53. That is, for example, during a test operation of the semiconductor package 12, at least one of the bonding wires 43 is electrically connected to the memory interface portion 54 without going through the host interface portion 53, for example, by electrical connection in the controller 31 being switched.

In addition, in another viewpoint, at least one of the bonding wires 43 may be electrically connected to the memory interface portion 54 of the controller 31, without going through the CPU 52 and the buffer 51. That is, for example, during the test operation of the semiconductor package 12, at least one of the bonding wires 43 is electrically connected to the memory interface portion 54 without going through the CPU 52 and the buffer 51, for example, by electrical connection in the controller 31 being switched.

As shown in FIG. 17, the first surface 11a of the substrate 11 includes a plurality of pads 70 which are electrically connected to the bonding wires 42 and 43 of the semiconductor package 12. The plurality of pads 70 includes a plurality of first pad 71 and a plurality of second pads 72. The first pads 71 are electrically connected to the interface portion 15 of the substrate 11 and the bonding wires 42. The second pads 72 are electrically insulated from the interface portion 15 of the substrate 11. The second pads 72 are electrically connected to the second bonding wires 43.

As shown in FIGS. 16A to 16C, the second surface 11b of the substrate 11 includes a plurality of third pads 73. The plurality of third pads 73 is arranged corresponding to the plurality of second pads. That is, the size and arrangement of the plurality of third pads 73 are substantially the same as the size and arrangement of the plurality of second pads 72. In other words, the third pads 73 are located directly below a surface on which the second pads 72 are provided. The plurality of third pads 73 is located on the rear side of a region which is covered with the semiconductor package 12, in the substrate 11.

Figure 18:
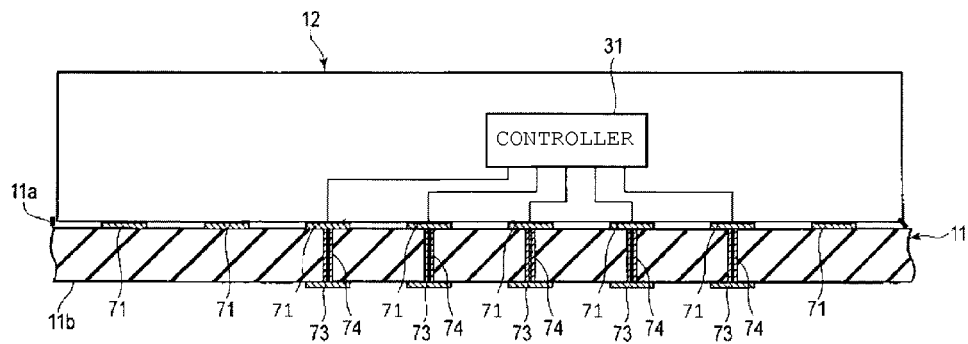
FIG. 18 schematically illustrates an electrical connection relationship in the semiconductor device according to the second embodiment.

FIG. 18 schematically shows an electrical connection relationship between the substrate 11 and the semiconductor package 12. The substrate 11 includes connection portions 74 that electrically connect the plurality of second pads 72 and the plurality of third pads 73 on a one-to-one basis. The connection portion 74 is, for example, a through hole or a via. As a result, the plurality of third pads 73 is electrically connected to the plurality of second pads 72, respectively. That is, each of the plurality of third pads 73 is electrically connected to the controller 31 through the connection portion 74, the first pad 71, and the bonding wire 42.

The third pad 73 is an example of the "test pad." That is, when a test of the semiconductor device 1 is performed, a test command (test signal) is input to the controller 31 through the third pad 73. When the test command is input to the controller 31 through the third pad 73, its response is acquired from the third pad 73, and whether writing and reading of the semiconductor memory 32 are normally performed is determined based on the response.

Specifically, the controller 31 and the semiconductor memory 32 may individually operate based on the test command input from at least one of the third pads 73. In the semiconductor device 1, various test commands are input to the third pad 73, and thus it is possible to perform a function check or a reliability check such as whether the controller 31 normally operates, whether the semiconductor memory 32 normally operates, whether the power supply of the semiconductor package 12 normally functions, or whether the semiconductor package 12 normally functions as a whole.

In the present embodiment, the number of third pads 73 is larger than the number of first pads 71. For example, twenty or more third pads 73 are provided. Thereby, many kinds of test commands may be input to the controller 31, and an accurate test may be implemented.

In the present embodiment, a test mode of the semiconductor device 1 includes, for example, a first mode and a second mode. The first mode is a state in which a unit test of the controller 31 may be performed. On the other hand, the second mode is, for example, a state in which electrical connection of the controller 31 is switched, and at least one of the third pads 73 is electrically connected to the memory interface portion 54 without going through the CPU 52 and the buffer 51. That is, the second mode is a state in which an access path capable of directly accessing the semiconductor memory 32 from at least one of the third pads 73 is set, and is a state in which a unit test of the semiconductor memory 32 may be performed.

Figure 19:
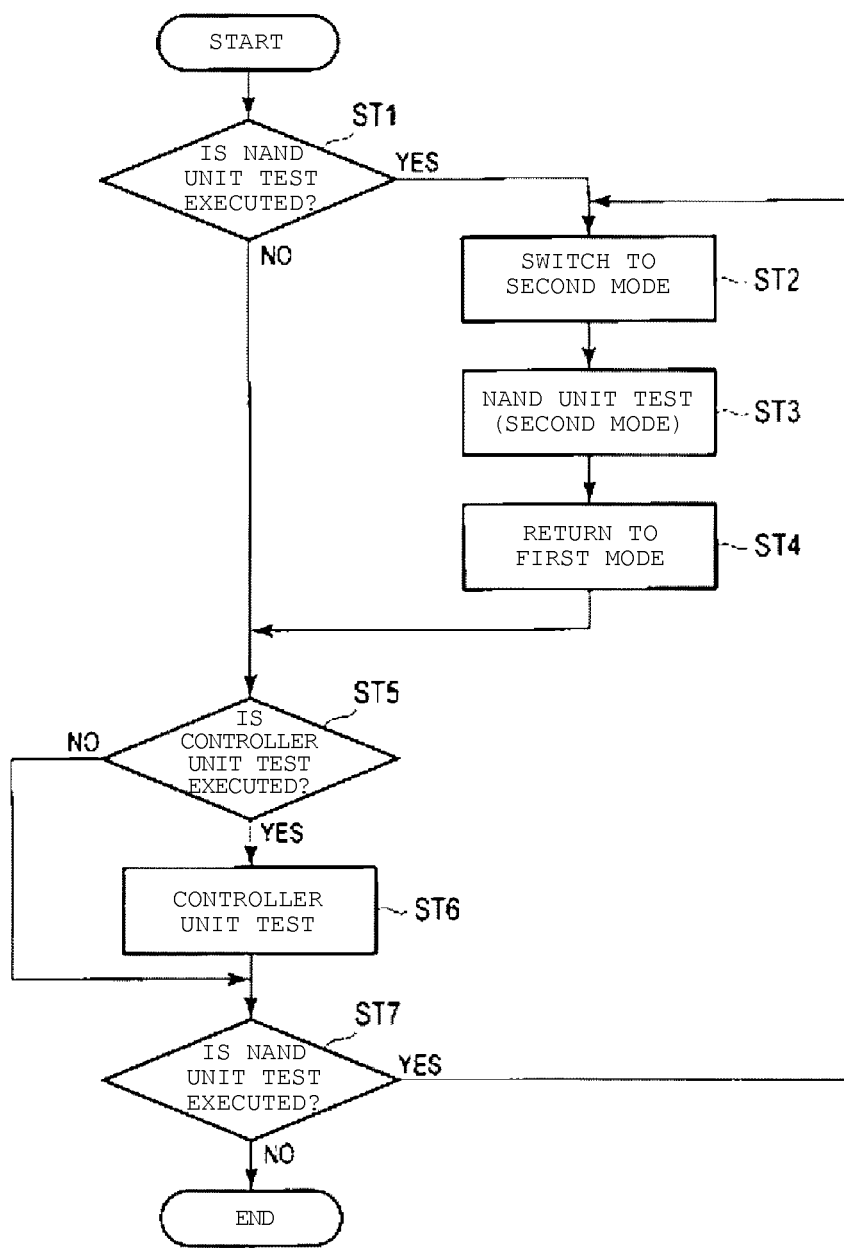
FIG. 19 is a flowchart illustrating an example of a test operation of the semiconductor device according to the second embodiment.

FIG. 19 shows an example of a flow of a test operation of the semiconductor device 1.

First, in step ST1, in the controller 31, it is determined whether the unit test of the semiconductor memory 32 is executed. When the unit test of the semiconductor memory 32 is determined to be executed (step ST1: YES), the flow proceeds to step ST2. When the unit test of the semiconductor memory 32 is determined to be not executed (step ST1: NO), the flow proceeds to step ST5.

In step ST1, the controller 31 sets an operating mode of the controller 31 to the second mode. When the operating mode of the controller 31 is set to the second mode, the flow proceeds to step ST3. In step ST3, the unit test of the semiconductor memory 32 is executed. In the unit test of the semiconductor memory 32, for example, write data is input from the third pad 73, readout data is acquired from the same or another third pad 73, the consistency of the write data with the readout data is determined, to thereby determine whether a defective location is included in the semiconductor memory 32.

As a result, in the semiconductor memory 32, a defect of bits (fail bits) in which erroneous data is held, bits (bad blocks) which are not able to be written and read out, and the like are determined.

When the unit test of the semiconductor memory 32 is terminated, the flow proceeds to step ST4. In step ST4, the controller 31 returns the operating mode of the controller 31 to the first mode. When the operating mode of the controller 31 returns to the first mode, the flow proceeds to step ST5. In step ST5, it is determined whether the unit test of the controller 31 is executed. When the unit test of the controller 31 is determined to be executed (step ST5: YES), the flow proceeds to step ST6. When the unit test of the controller 31 is determined to be not executed (step ST5: NO), the flow proceeds to step ST7.

In step ST6, in the semiconductor device 1, the unit test of the controller 31 is executed. Here, an arbitrary command is input from the third pad 73 to the controller 31, and a test such as a normal response of the controller 31 is executed. When the unit test of the controller 31 is terminated, the flow proceeds to step ST7.

In step ST7, in the controller 31, it is determined whether the unit test of the semiconductor memory 32 is executed. When the unit test of the semiconductor memory 32 is determined to be executed (step ST7: YES), the flow returns to step ST2. When the unit test of the semiconductor memory 32 is determined to be not executed (step ST7: NO), the test operation is terminated. Meanwhile, the test of the semiconductor device 1 is not limited to those describe above, and a test of the entire semiconductor package 12 or other tests may be performed.

Figure 20:
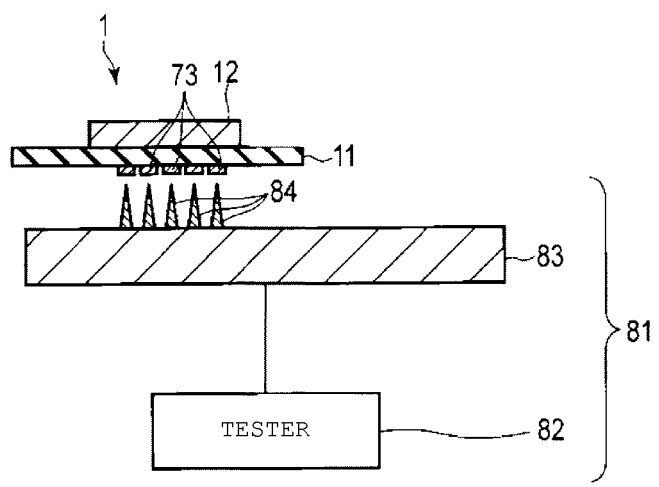
FIG. 20 is a cross-sectional view of a test device and the semiconductor device according to the second embodiment.

FIG. 20 shows an example of a test device 81 which is used in the test of the semiconductor device 1. The test device 81 includes a tester 82, a stage 83, and a plurality of test pins 84 (probe). The tester 82 is connected to the stage 83. The plurality of test pins 84 are arranged upright on the stage 83, and are connected to the tester 82 through the stage 83. The plurality of test pins 84 are arranged corresponding to the third pad 73.

When the test of the semiconductor device 1 is performed, the test pin 84 is brought into contact with the third pad 73. The test command is then input from the tester 82 through the third pad 73 to the controller 31, and a response from the controller 31 is determined by the tester 82. In the semiconductor device 1, a plurality of types of tests may be performed, for example, by replacing the tester 82. In the semiconductor device 1, the test of the controller 31 and the test of the semiconductor memory 32 may also be performed separately.

Figure 21:
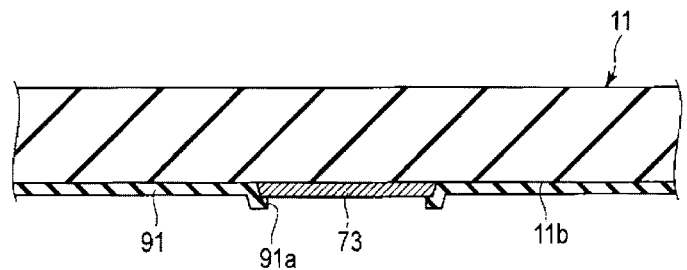
FIG. 21 is a cross-sectional view of a third pad of the semiconductor device according to the second embodiment.

FIG. 21 shows an example of the substrate 11. As shown in FIG. 21, the third pad 73 may be exposed from an opening 91a of a solder resist 91 which is provided on the second surface 11b of the substrate 11. The solder resist 91 is an example of an "insulating layer" and an "insulating portion."

Figure 22:
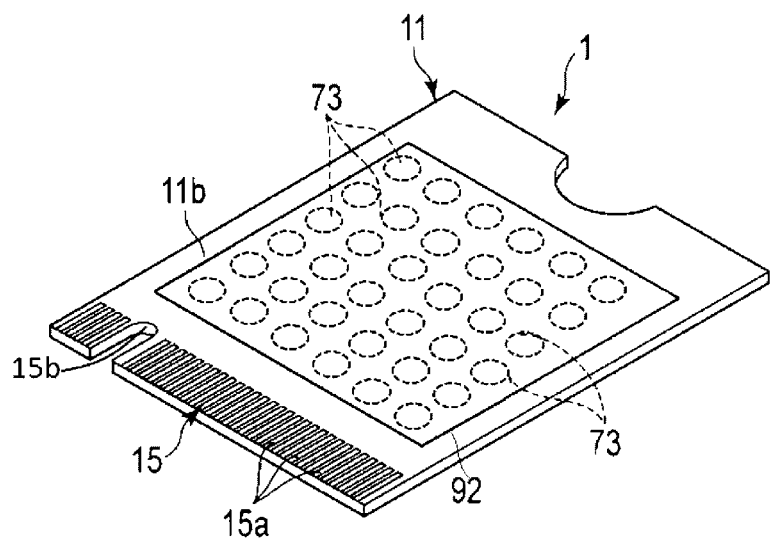
FIG. 22 is a perspective view of a rear surface of the semiconductor device according to the second embodiment.

FIG. 22 shows the second surface 11b of the substrate 11. As shown in FIG. 21, a label 92 which covers the plurality of third pads 73 integrally may be attached to the second surface 11b of the substrate 11. The label 92 is an example of a "sheet," an "insulating sheet," and an "insulating portion." The label 92 is formed of, for example, a material having thermal conductivity greater than that of the solder resist 91. The label 92 is made of, for example, carbon graphite.

Since the third pad 73 is connected to the bonding wire 42 of the controller 31 by, for example, the connection portion 74 having excellent thermal conductivity, a portion of heat has a tendency to move from the controller 31. Therefore, for example, when the label 92 having thermal conductivity greater than that of the solder resist 91 is provided, it is possible to enhance the heat dissipation of the semiconductor device 1.

Figure 23:
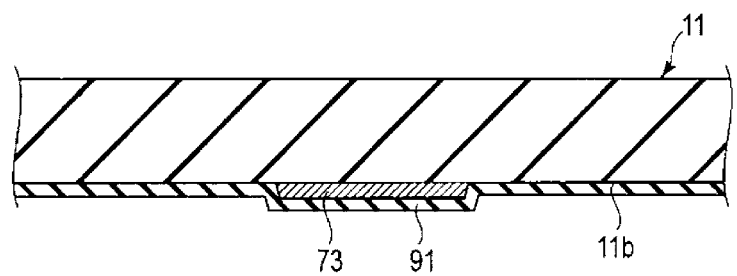
FIG. 23 is a cross-sectional view of the third pad according to a modification example.

FIG. 23 shows a modification example of the substrate 11. As shown in FIG. 23, the third pad 73 is covered with the solder resist 91 provided on the second surface 11b of the substrate 11, and the solder resist 91 may be removed so as to expose the third pad 73 during usage. In addition, the third pad 73 may be covered with the solder resist 91, for example, after the test is terminated.

In the above configuration, for convenience of description, the second pad 72 may be referred to as the "first pad," and the third pad 73 may be referred to as the "second pad."

According to the semiconductor device 1 having such a configuration, it is possible to facilitate the performance confirmation of the semiconductor device 1 and each component included in the semiconductor device 1. That is, the semiconductor device 1 according to the present embodiment includes the substrate 11, the semiconductor package 12, and the pads 72 and 73. The substrate 11 includes a first surface 11a and a second surface 11b opposite to the first surface 11a. The pad 72 is provided on the first surface 11a of the substrate 11. The semiconductor package 12 includes a controller 31 and a bonding wire 42 which is electrically connected to the controller 31 through the pad 71. The pad 73 is provided on the second surface 11b of the substrate 11 and electrically connected to the pad 71.

According to such a configuration, the operation confirmation of the controller 31 and the operation confirmation of the semiconductor package 12 may be performed using the pad 73, which is provided on the second surface 11b of the substrate 11. As a result, it is possible to improve the reliability of the semiconductor device 1.

In the present embodiment, the semiconductor device 1 includes an interface portion 15, provided on the substrate 11, in which a signal flows to and from the host device 2. The pads 72 and 73 are electrically insulated from the interface portion 15. According to such a configuration, since direct access to the controller 31 may be performed without going through the interface portion 15, it is possible to easily perform the test of the controller 31.

In the present embodiment, the controller 31 may operate on the basis of a test command input from the pad 73. According to such a configuration, various test commands are input to the pad 73, and thus it is possible to easily perform an accurate test operation of the semiconductor device 1. As a result, it is possible to facilitate the test of the semiconductor device 1 and improve reliability of the semiconductor device 1.

In the present embodiment, the pad 73 is located on the rear side of a region which is covered by the semiconductor package 12, in the substrate 11. According to such a configuration, it is possible to simplify a positional relationship between the pad 73 and a solder ball 62 of the semiconductor package 12. Further, it is possible to facilitate the test of the semiconductor device 1 and the arrangement of the test pins 84 of the test device 81 or the like.

In the present embodiment, an insulating portion (label 92 or solder resist 91) that covers the pad 73 is further included. According to such a configuration, it is possible to prevent malfunction based on the erroneous input of a signal from the pad 73 during ordinary usage.

In the present embodiment, the substrate 11 is a single-sided mounting substrate, and the second surface 11b is a non-component mounting surface. That is, in the present embodiment, the test pad 73 is arranged using the non-component mounting surface of the single-sided mounting substrate. According to such a configuration, a high-density design in order to provide a pad in a narrow region of the first surface 11a of the substrate 11, the adjustment of mounting positions for other components mounted on the first surface 11a, and the like are not required.

In addition, since the pad 73 may be arranged using a relative large area of the second surface 11b, it is possible to dispose a sufficiently large number of pads 73, and to perform a more accurate test of the semiconductor device 1. Further, since a test pad electrode can be provided on the back of each component mounted on the first surface 11a, it is possible to shorten a wiring length for routing and to avoid an electrical loss.

In addition, since the plurality of pads 73 may be arranged at intervals with plenty of margins by using a relative large area, it also enables the arrangement of the test pins 84 of the test device 81, and an operation to make the test pins 84 be in contact with the pad 73.

In the present embodiment, the number of third pads 73 is larger than the number of first pads 71. According to such a configuration, it is possible to perform a more accurate test of the semiconductor device 1. In addition, in the present embodiment, the arrangement of the plurality of third pads 73 corresponds to the arrangement of the plurality of second pads 72. According to such a configuration, it is possible to further simplify a positional relationship between the pad 73 and a bonding wire 62 of the semiconductor package 12, and to further facilitate the test of the semiconductor device 1.

Here, for the purpose of comparison, it is assumed that in a semiconductor device, a line connected to the test pad is extracted from the course of a signal line between the interface portion 15 of the substrate 11 and the controller 31. According to such a configuration, when the impedance of a signal line changes by providing the test line, for example, a high-speed differential signal flows, the signal quality of the signal may be deteriorated.

In contrast, in the present embodiment, the controller 31 includes a host interface portion 53 which is connected to the interface portion 15 of the substrate 11, and a memory interface portion 54 which is connected to the semiconductor memory 32. At least one of the plurality of third pads 73 may be electrically connected to the memory interface portion 54 of the controller 31 without going through the host interface portion 53. According to such a configuration, since the impedance of the signal line between the interface portion 15 of the substrate 11 and the controller 31 is not influenced, it is possible to maintain a high signal quality of the signal flowing to the signal line.

In the present embodiment, the controller 31 includes a CPU 52 and the memory interface portion 54 which is electrically connected to the semiconductor memory 32. At least one of the plurality of third pads 73 may be electrically connected to the memory interface portion 54 of the controller 31, without going through the CPU 52. According to such a configuration, since direct access to the memory interface portion 54 may be performed, it is possible to facilitate the unit test of the semiconductor memory 32 and to improve the accuracy thereof.

In the present embodiment, the test pad provided on the rear surface of the substrate is relatively small in the thickness itself, and the thickness of the device itself is not changed greatly as compared to the semiconductor device according to first embodiment. Therefore, as shown in FIGS. 2 and 3, even when the test pad is disposed on, for example, the screen side of the detachable notebook PC, it is not necessary to change the standard of the thickness of the tablet itself.

Next, semiconductor devices 1 according to third and fourth embodiments will be described. Here, components having the same or similar functions as or to those of the components in the first embodiment are described by the same reference numerals and signs, and the description thereof may not be given. In addition, components other than those described below are the same as those in the first embodiment.

Third Embodiment

Figure 24:
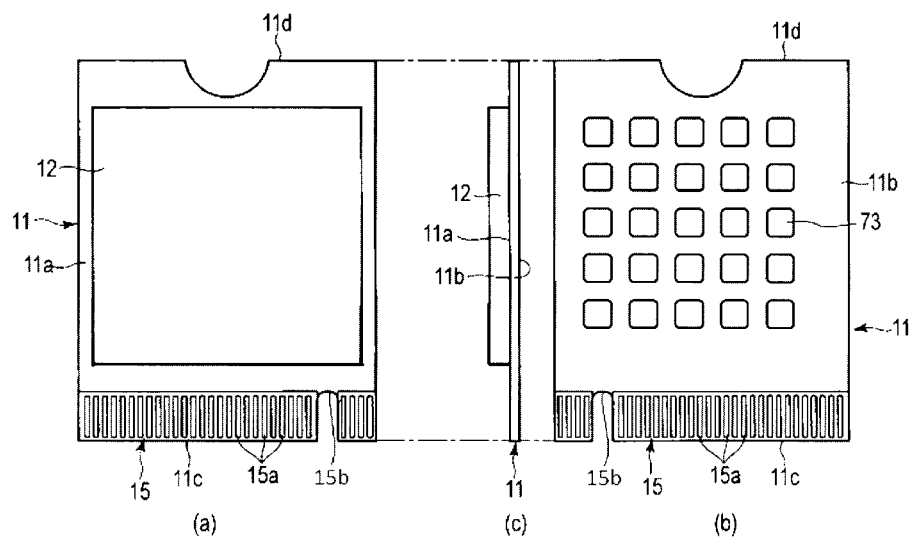
FIG. 24 illustrates a semiconductor device according to a third embodiment.

FIG. 24 shows an example of the semiconductor device 1 according to the third embodiment. In FIG. 24, (a) is a top plan view, (b) is a bottom plan view, and (c) is a side view of the semiconductor device 1. Each of the plurality of third pads 73 of the substrate 11 according to the present embodiment is formed in a substantially rectangular shape which is rounded at corners. With such a configuration, it is also possible to achieve substantially the same function as that in the second embodiment.

Fourth Embodiment

Figure 25:
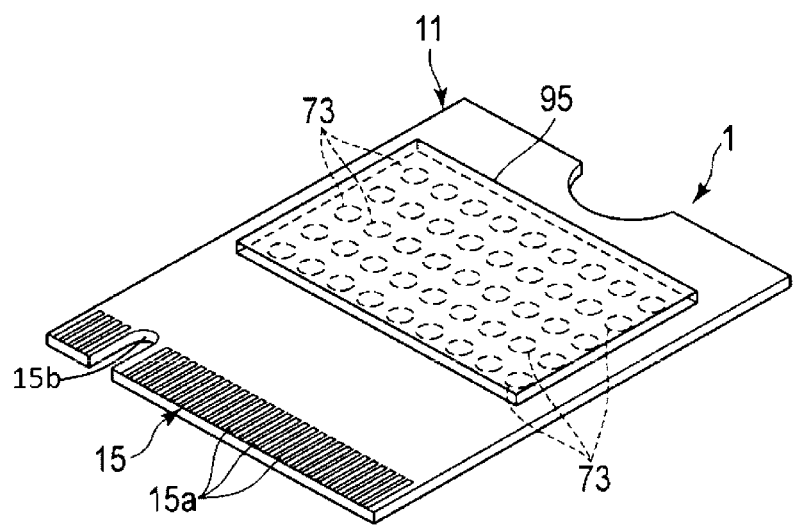
FIG. 25 is a perspective view of a rear surface of a semiconductor device according to a fourth embodiment.

FIG. 25 shows an example of the semiconductor device 1 according to the fourth embodiment. The semiconductor device 1 according to the present embodiment includes a metallic heat-dissipating plate 95 instead of the label 92. The heat-dissipating plate 95 is formed of, for example, metal, such as aluminum, which has thermal conductivity higher than, for example, that of the solder resist 91. The heat-dissipating plate 95 covers, for example, the plurality of third pads 73 integrally, and is thermally connected to the third pads 73. According to such a configuration, since the controller 31 and the heat-dissipating plate 95 may be relatively firmly connected to each other in a thermal aspect through the second bonding wire 62, the second pad 72, the connection portion 74, and the third pad 73, it is possible to further enhance the heat dissipation of the semiconductor device 1.

As stated above, the first to fourth embodiments and the modification examples are described, but the embodiment of the semiconductor device 1 is not limited thereto. For example, the arrangement and the number of third pads 73 are not limited to specific ones, and may be implemented by appropriate setting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a substrate including a host interface on an edge thereof;
    a semiconductor memory unit mounted on a surface of the substrate;
    a memory controller configured to control the semiconductor memory unit and mounted on the surface of the substrate adjacent to the semiconductor memory unit, the memory controller including a host interface section configured to receive data from and transmit data to the host interface, the host interface section being positioned adjacent to an edge of the memory controller that faces said edge of the substrate; and
    a sealing layer disposed on the surface of the substrate and covering the semiconductor memory unit and the memory controller.

2. The semiconductor device according to claim 1, wherein
    the edge of the memory controller is parallel to said edge of the substrate.

3. The semiconductor device according to claim 1, wherein
    the memory controller has an edge adjacent to the semiconductor memory unit that extends parallel to an edge of the semiconductor memory unit, and
    a plurality of connection terminals is formed along edges of the memory controller except for said edge adjacent to the semiconductor memory unit.

4. The semiconductor device according to claim 3, wherein
    a plurality of connection terminals is formed along edges of the semiconductor memory unit except for said edge of the semiconductor memory unit adjacent to the memory controller and an edge opposite to said edge of the semiconductor memory unit adjacent to the memory controller.

5. The semiconductor device according to claim 1, wherein
the semiconductor memory unit has an edge adjacent to the memory controller that extends parallel to an edge of the memory controller, and
a plurality of connection terminals is formed along edges of the semiconductor memory unit except for said edge adjacent to the memory controller and an edge opposite to said edge of the semiconductor memory unit adjacent to the memory controller.

6. The semiconductor device according to claim 1, wherein
the substrate includes a plurality of wirings to electrically connect the memory controller and the semiconductor memory unit, and
the wirings extend across a region of the substrate corresponding to the memory controller.

7. The semiconductor device according to claim 6, wherein
the wirings also extend across a region of the substrate corresponding to the semiconductor memory unit.

8. The semiconductor device according to claim 6, wherein
the wirings and the memory controller are electrically connected through a plurality of bonding wires.

9. The semiconductor device according to claim 1, wherein
the substrate includes a plurality of wirings to electrically connect the memory controller and the semiconductor memory unit, and
the wirings extend across a region of the substrate corresponding to the semiconductor memory unit.

10. The semiconductor device according to claim 9, wherein
the wirings and the semiconductor memory unit are electrically connected through a plurality of bonding wires.

11. The semiconductor device according to claim 1, wherein
the semiconductor memory unit includes a plurality of stacked semiconductor memory elements.

12. The semiconductor device according to claim 1, wherein
a longitudinal direction of a plane of the memory controller along the surface of the substrate is parallel to a longitudinal direction of a plane of the semiconductor memory unit along the surface of the substrate.

13. The semiconductor device according to claim 1, wherein
a height of the sealing layer above a region of the substrate corresponding to the memory controller is the same as a height of the sealing layer above a region of the substrate corresponding to the semiconductor memory unit.

14. A method for manufacturing a semiconductor device, comprising:
disposing a semiconductor memory unit on a surface of a substrate;
disposing a memory controller on the surface of the substrate, the semiconductor memory unit and the memory controller being adjacent to each other; and
forming a sealing layer on the surface of the substrate so as to cover the semiconductor memory unit and the memory controller, wherein
the substrate includes a host interface on an edge thereof,
the memory controller includes a host interface section configured to receive data from and transmit data to the host interface, along an edge of the memory controller, and
the memory controller is disposed, such that the edge of the memory controller faces said edge of the substrate.

15. The method according to claim 14, wherein
the forming of the sealing layer includes
locating the substrate on which the semiconductor memory unit and the memory controller are disposed, in a space of a mold,
introducing a material of the sealing layer into the space; and
solidifying the material.

16. The method according to claim 15, wherein
the material is introduced above the semiconductor memory unit over a space above the memory controller.

17. The method according to claim 14, wherein
the memory controller is disposed, such that the edge of the substrate is parallel to the edge of the memory controller.

18. The method according to claim 14, wherein
the semiconductor memory unit includes a plurality of semiconductor memory elements, and
the semiconductor memory unit is disposed by stacking a plurality of semiconductor memory elements.

19. The method according to claim 14, wherein
the semiconductor memory unit and the memory controller are disposed, such that a longitudinal direction of a plane of the memory controller along the surface of the substrate is parallel to a longitudinal direction of a plane of the semiconductor memory unit along the surface of the substrate.

20. The method according to claim 14, wherein
the sealing layer is formed, such that a height of the sealing layer above a region of the substrate corresponding to the memory controller is the same as a height of the sealing layer above a region of the substrate corresponding to the semiconductor memory unit.

* * * * *